United States Patent
Gschwind-Schilling

(10) Patent No.: US 10,141,843 B2
(45) Date of Patent: Nov. 27, 2018

(54) SWITCHING CONVERTER, CONTROL UNIT AND METHOD FOR OPERATING A SWITCHING CONVERTER CIRCUIT DEVICE

(71) Applicant: Robert Bosch GmbH, Stuttgart (DE)

(72) Inventor: Rainer Gschwind-Schilling, Rutesheim (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/533,779

(22) PCT Filed: Dec. 2, 2015

(86) PCT No.: PCT/EP2015/078392
§ 371 (c)(1),
(2) Date: Jun. 7, 2017

(87) PCT Pub. No.: WO2016/091687
PCT Pub. Date: Jun. 16, 2016

(65) Prior Publication Data
US 2017/0331377 A1    Nov. 16, 2017

(30) Foreign Application Priority Data
Dec. 8, 2014    (DE) .................. 10 2014 225 172

(51) Int. Cl.
*G05F 1/565*    (2006.01)
*H02M 3/156*    (2006.01)
(Continued)

(52) U.S. Cl.
CPC ............ *H02M 3/1563* (2013.01); *G06F 1/10* (2013.01); *H02M 1/44* (2013.01); *H02M 3/1588* (2013.01);
(Continued)

(58) Field of Classification Search
CPC ........................................................ G05F 1/565
(Continued)

(56) References Cited

U.S. PATENT DOCUMENTS

| | | |
|---|---|---|
| 5,537,305 A | 7/1996 | Colotti |
| 6,687,319 B1 | 2/2004 | Perino et al. |

(Continued)

FOREIGN PATENT DOCUMENTS

| | | |
|---|---|---|
| DE | 3802863 A1 | 8/1989 |
| DE | 102014003662 A1 | 9/2014 |
| EP | 1184961 A1 | 3/2002 |

OTHER PUBLICATIONS

International Search Report dated Apr. 1, 2016, of the corresponding International Application PCT/EP2015/078392 filed Dec. 2, 2015.

*Primary Examiner* — Adolf Berhane
*Assistant Examiner* — Nusrat Quddus
(74) *Attorney, Agent, or Firm* — Norton Rose Fulbright US LLP; Gerard Messina

(57) ABSTRACT

A switching converter, including an input interface for providing an input voltage, an output interface for providing at least one output voltage, a voltage conversion device for converting the provided input voltage into one of the at least one output voltage, and a clock generator for providing a working clock, the clock generator being configured in such a way that the clock generator provides a modulated basic clock as the working clock. A control unit including such a switching converter, and a method for operating such a switching converter, are also described.

13 Claims, 9 Drawing Sheets

(51) Int. Cl.
*H02M 1/44* (2007.01)
*G06F 1/10* (2006.01)
*H02M 3/158* (2006.01)
*H02M 3/28* (2006.01)
*H03L 7/16* (2006.01)
*H02M 1/12* (2006.01)
*H02M 1/00* (2006.01)

(52) U.S. Cl.
CPC .............. *H02M 3/285* (2013.01); *H03L 7/16* (2013.01); *H02M 1/12* (2013.01); *H02M 2001/0003* (2013.01); *H02M 2003/1586* (2013.01); *H04B 2215/067* (2013.01)

(58) Field of Classification Search
USPC .......................................... 323/282–286, 315
See application file for complete search history.

(56) References Cited

U.S. PATENT DOCUMENTS

| | | |
|---|---|---|
| 2005/0185731 A1 | 8/2005 | Hardin et al. |
| 2012/0063552 A1 | 3/2012 | Jain |
| 2012/0126901 A1 | 5/2012 | Leung et al. |
| 2013/0293138 A1* | 11/2013 | Takahashi ............. H02M 3/156 |
| | | 315/224 |
| 2014/0328090 A1 | 11/2014 | Takahashi et al. |

* cited by examiner

SWITCHING CONVERTER, CONTROL UNIT AND METHOD FOR OPERATING A SWITCHING CONVERTER CIRCUIT DEVICE

FIELD

The present invention relates to a switching converter, to a control unit, and to a method for operating a switching converter.

BACKGROUND INFORMATION

The technical function of switching converters is to convert voltages from a first voltage level to at least one second voltage level. This may be from a low voltage (e.g., 13.5 V) to a high voltage (e.g., 33 V). Furthermore, there are voltage converters which convert a high voltage (e.g., 33 V) into a low voltage (e.g., 6 V).

The voltage converters usually have an essentially fixed working clock, such as 2 MHz.

As a result of the technical function of the voltage converter, parasitic, electromagnetic interferences are generated. These interferences are partially directly related to the working clock. A switching converter operated at a working clock of 2 MHz generates harmonic interferences at distances of 2 MHz. The amplitude of the individual interference sources and the maximum interfering frequency are dependent on the configuration of the switching converter.

The interferences often make additional measures necessary so that, for example, control units in which the switching converters are used, meet statutory requirements or customer requirements with respect to the (electromagnetic) emissions.

One of a variety of measures is the controlled variation of the working clock. This variation is usually referred to as jitter. The variation of the clock is usually set to the maximum frequency variation which the switching converter control unit is still able to reasonably process. The idea behind this is that a maximum frequency variation causes a maximum reduction in the emission.

One disadvantage of this technique is that only a partial optimization (a frequency range) of the emissions takes place here, and not all issues, such as the additional frequency range or the radio reception in the immediate surroundings of such switching converters, are taken into consideration.

The interferences by switching converters according to the related art usually do not take place due to direct demodulation, but due to indirect demodulation via the intermodulation effect with the aid of an FM transmitter. There is also the effect that the switching converter emissions have "matching" frequencies and then, in combination with the superimposed spectrum of an FM transmitter, become (undesirably) audible due to a direct demodulation.

SUMMARY

In accordance with the present invention, a switching converter, a control unit, and a method for operating a switching converter are provided, whose electromagnetic emissions are optimized and in which the effects on an FM radio reception are considered.

Such a switching converter includes, among other things, an input interface for providing an input voltage, an output interface for providing at least one output voltage, a voltage conversion device for converting the provided input voltage into one of the at least one output voltage, and a clock generator for providing a working clock.

By configuring the clock generator in such a way that the clock generator provides a modulated basic clock as the working clock, it is achieved that the electromagnetic emissions of the switching converter are optimized, and the effects of the switching converter on an FM radio reception taking place in the vicinity of such a switching converter are taken into consideration.

A basic clock in the present example shall be understood to mean a clock which is provided by a suitable clock unit, such as an oscillator. Typically, such clock units have a certain tolerance.

A working clock in the present example shall be understood to mean the clock rate which the clock generator provides to further components. The further components of the switching converter are operated based on this clock rate.

A frequency modulation in the present example shall be understood to mean that the basic clock of the clock generator, serving as the carrier frequency, is varied with the aid of modulation frequencies within a predetermined frequency deviation.

A frequency modulation is described via its characteristic variables. These are:

The carrier frequency ($f_T$), which is a signal being modulated.

The modulation frequency ($f_S$), which is a signal modulated onto carrier frequency $f_T$.

The frequency deviation ($\Delta f_T$) denotes the change in carrier frequency $f_T$ caused by the modulation.

The variation or the frequency sweep ($f_{S\_sweep}$) denotes the frequency with which the modulation frequency is being varied.

Electromagnetic emissions in the present example shall be understood to mean electromagnetic radiation from the switching converter. This radiation may cause interferences in adjoining electronic or electrical systems. In particular, perceptible artefacts may audibly arise due to electromagnetic radiation in the FM radio reception, which impair the sound experience (crackling, noise and the like), particularly in the case of weak radio reception.

A variety of measuring techniques are available for measuring electromagnetic emission: average detector (AVG, "mean value evaluation of the signal"), peak detector (PK, "peak value evaluation of the signal"), and quasi-peak detector (QPK, "time-weighted peak value evaluation of the signal"). Further evaluation factors are the resolution/measuring bandwidth (RBW), which represents the "frequency-selective measuring window." Typical values are 9 kHz, 120 kHz, 1 MHz. Another evaluation factor is the measuring duration per frequency point.

Interferences by switching converters according to the related art usually do not take place due to direct demodulation, but due to indirect demodulation via the intermodulation effect with the aid of a regular FM transmitter, for example.

According to the present invention, a direct, i.e., interfering or audible, demodulation with and without an FM transmitter is not possible since the used modulation frequencies $f_S$ are not frequencies of FM transmission. During the indirect demodulation via the intermodulation effect, the demodulated signal is influenced via the used frequencies $f_S$ and the modulation period duration in such a way that, at a very strong interference level, the audible impression of (atmospheric) noise arises. At a weak interference level, the interferences are not discernible.

Further advantageous embodiments of the switching converter according to the present invention are derived from the dependent claims and from the following description of specific embodiments.

In one advantageous embodiment of the switching converter, the clock generator modulates the basic clock with a predetermined frequency deviation and one or multiple predetermined modulation frequencies and at least one predetermined modulation period duration.

Advantageously, the multiple modulation frequencies are equidistant with respect to one another. In this way, a particularly easy implementation of the modulation is possible.

In one alternative specific embodiment, the multiple modulation frequencies have logarithmic separations from one another. In this way, a particularly good optimization of the electromagnetic emissions may be achieved.

Advantageously, the modulation period duration is between 5 ms and 15 ms, preferably between 10 ms and 11.1 ms. As a result of this selection of the modulation period duration, together with an appropriate selection of modulation frequencies which are not used for FM radio broadcasting, it is achieved that the electromagnetic interferences are perceived as (atmospheric) noise at a high interference level.

Advantageously, the one or multiple modulation frequencies are between 10 kHz and 20 kHz, preferably between 16 kHz and 18 kHz.

If the modulation frequencies are outside the frequency band used for the FM radio broadcasting, a direct demodulation of the electromagnetic emissions is prevented.

Advantageously, the frequency deviation is less than 15% of the basic clock, preferably less than 10% of the basic clock, in particular essentially 9% of the basic clock.

In general, the activation principle described with respect to a switching converter may also be applied to other "switched" interferences. In the case of deviating parameters, e.g., frequency deviation, basic clock/working clock etc., the remaining "non-deviating" parameters must be readjusted.

A maximum reduction of the emission becomes possible when the "partially overlapping" sidebands are matched to one another in such a way that they also sufficiently "cancel one another out" during the required measurement. If parameters are set incorrectly, the use of frequency modulation may result in a higher measured emission level than without the use of frequency modulation. The same also applies to the used modulation frequencies $f_S$. The frequency and modulation period duration of these must be adapted to the radio service which is not to be interfered with.

Specific embodiments of the switching converter according to the present invention are described in greater detail hereafter.

Experiments have shown that a particularly good optimization of the emissions may be achieved at a basic clock $f_T$ of 1.875 MHz and a frequency deviation $\Delta f_T$ of 9% when the modulation frequencies are between $f_{S\_sweep}$ 17 and 18 kHz and have a logarithmic separation from one another and when a modulation period duration of 10 ms is used.

At this setting, the maximum reduction of the measured emissions is achieved. Another point is that no identifiable interference noise occurs in the FM radio reception. The received interference signal is (indirectly) demodulated and is only audible as noise. This noise is not distinguishable from atmospheric noise, which is audible when, for example, no FM transmitter is being received.

A further advantageous specific embodiment has the following settings. The basic clock $f_T$ is 1.875 MHz (±5% tolerance). The used frequency deviation $\Delta f_T$ is 9% (based on the basic clock). The modulation frequencies $f_{S\_sweep}$ are implemented as 7 individual frequencies (16.2 kHz; 16.5 kHz; 16.8 kHz; 17.1 kHz; 17.4 kHz; 17.7 kHz; 18.0 kHz). The modulation period duration $f_{S\_sweep}$ is 11.1 ms.

These settings have proven to be optimal with respect to the FM signal quality and easy implementation.

The following tables show the metrologically ascertained reduction potential of the switching converter according to the present invention based on the above-described specific embodiment.

Reduction potential of the special frequency modulation:

Range 1 MHz to 30 MHz:

RBW: 9 kHz

| Setup | max. PK | max. AVG | PK reduction | AVG reduction |
| --- | --- | --- | --- | --- |
| without FM | 125 dBµV | 125 dBµV | — | — |
| with FM | 115 dBµV | 114 dBµV | 10 dB | 11 dB |

Range 76 MHz to 108 MHz:

RBW: 9 kHz

| Setup | max. PK | max. AVG | PK reduction | AVG reduction |
| --- | --- | --- | --- | --- |
| without FM | 92 dBµV | 92 dBµV | — | — |
| with FM | 79 dBµV | 68 dBµV | 13 dB | 25 dB |

RBW: 120 kHz

| Setup | max. PK | max. AVG | PK reduction | AVG reduction |
| --- | --- | --- | --- | --- |
| without FM | 92 dBµV | 92 dBµV | — | — |
| with FM | 85 dBµV | 78 dBµV | 7 dB | 14 dB |

Example embodiments of the present invention are described in greater detail below based on the figures by way of example.

DETAILED DESCRIPTION OF EXAMPLE EMBODIMENTS

Figure 1:
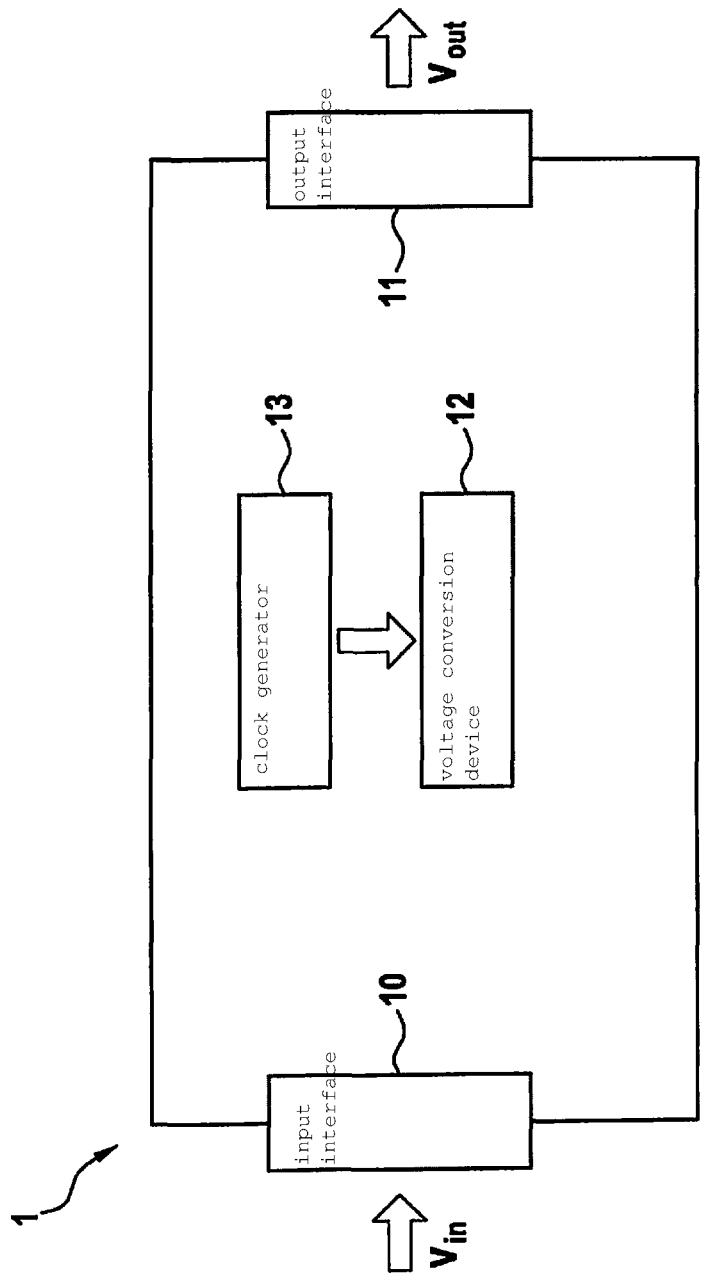
FIG. 1 shows a schematic view of a switching converter according to the present invention.

In the description below of favorable exemplary embodiments of the present invention, identical or similar reference numerals are used for similarly acting elements shown in the different figures, and a repeated description of these elements is dispensed with.

FIG. 1 shows a schematic view of a switching converter 1 according to the present invention. Switching converter 1 includes an input interface 10 for providing an input voltage $V_{in}$, an output interface 11 for providing at least one output voltage $V_{out}$, and a voltage conversion device 12 for converting the provided input voltage $V_{in}$ into one of the at least one output voltage [sic] $V_{out}$. Furthermore, switching converter 1 according to the present invention includes a clock generator 13, which provides a modulated basic clock $Clk_{base}$ as working clock $Clk_{modulated}$.

Figure 2:
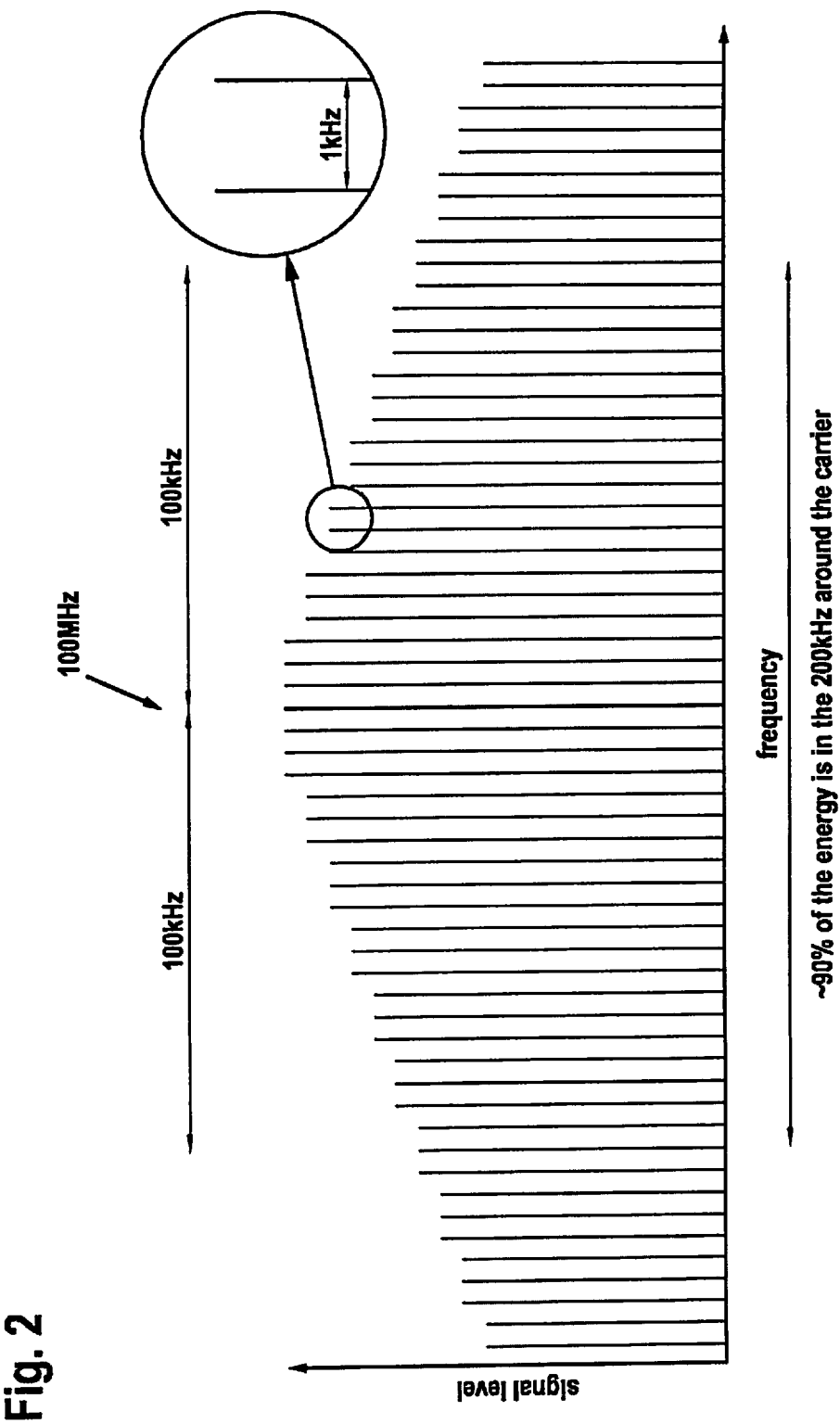
FIG. 2 shows a spectral representation of an exemplary frequency modulation.

FIG. 2 shows a spectral representation of an exemplary frequency modulation. The settings for the shown frequency modulation FM are as follows:
Carrier frequency $f_T$: 100 MHz
Frequency deviation $\Delta f_T$: 100 kHz
Modulation frequency $f_S$: 1 kHz
The spectra shown "to the left and right" of the carrier are the upper and lower sidebands.

Figure 3:
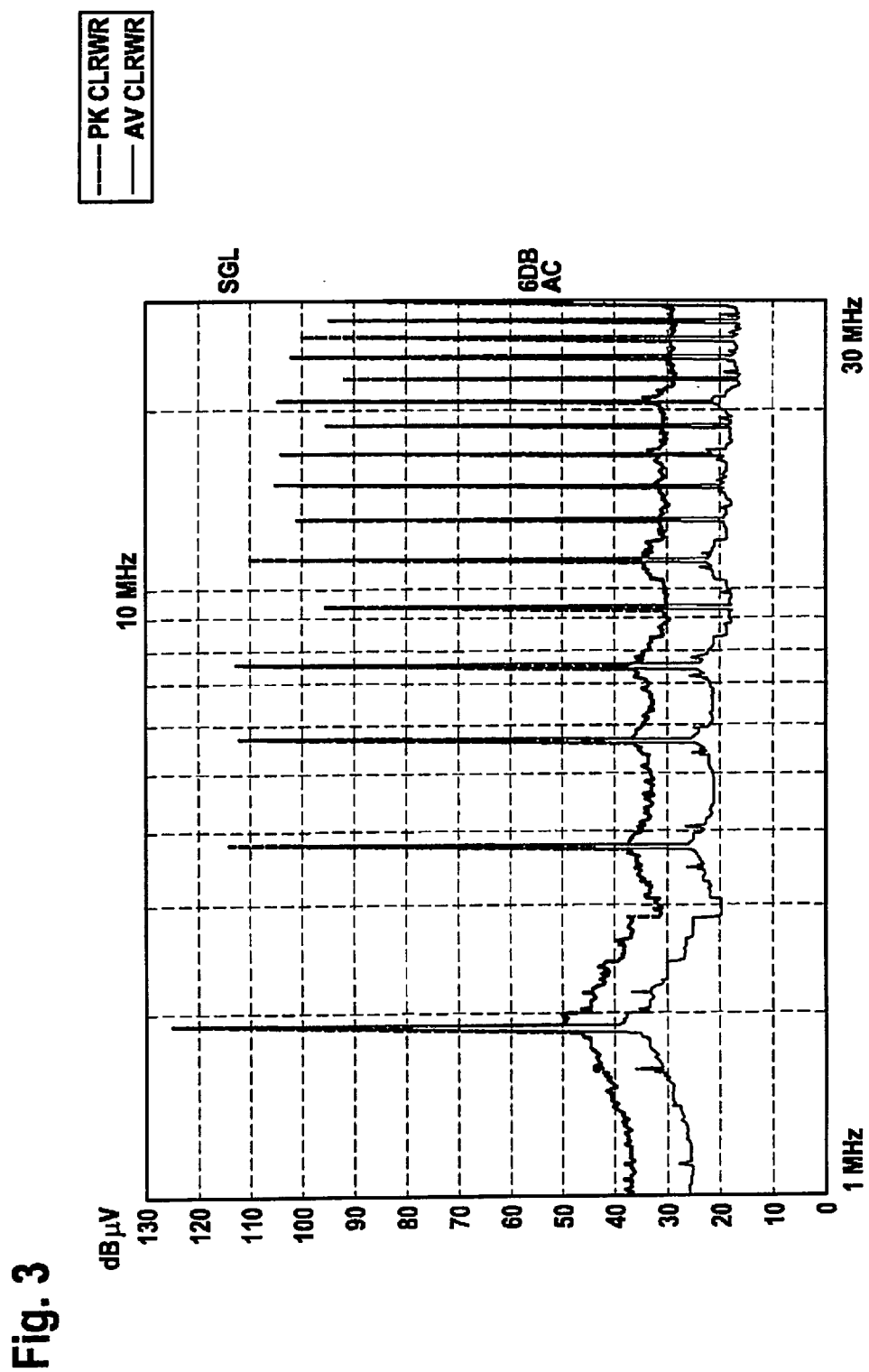
FIG. 3 shows an emission spectrum of a switching converter from the related art.

FIG. 3 shows an emission spectrum of a switching converter from the related art having a working frequency of 1.87525 MHz.

The spectrum of interference of a switching converter is defined by its rectangular activation of the converter choke. This rectangle is spectrally made up of many harmonic sinusoidal oscillations, which are each an integer multiple of the base frequency (1, 2, 3, 4, 5, . . . ). The amplitudes of the spectrum are dependent on the load situation of the switching converter. Furthermore, the amplitude ratio of the harmonics among one another is dependent on the pulse/pause ratio of the rectangular activation of the converter choke. The solid curve represents the spectrum according to an average detector (AVG), and the thick, dotted curve represents the spectrum according to a peak detector (PK).

Figure 4:
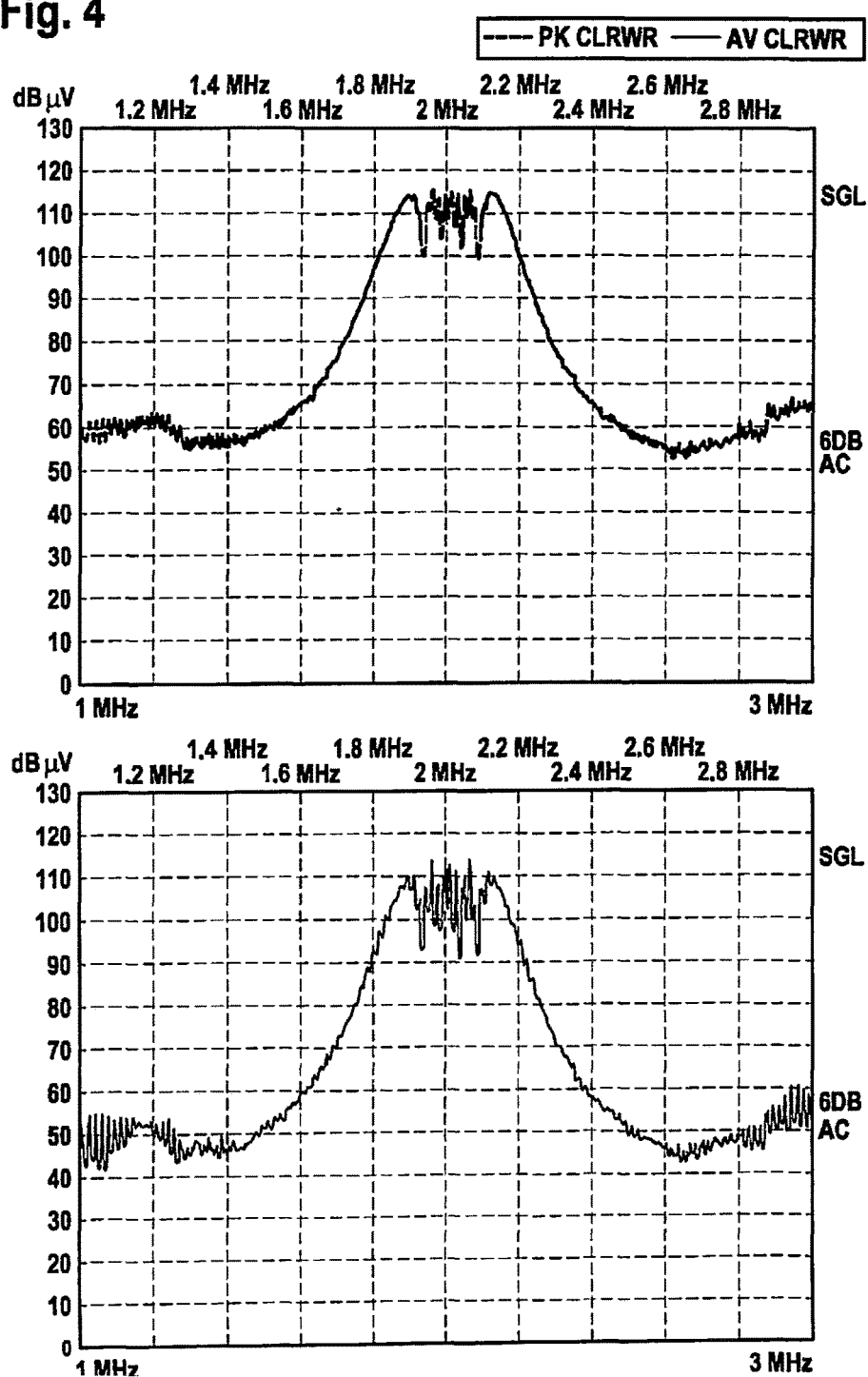
FIG. 4 shows an emission spectrum of a switching converter according to the present invention.

FIG. 4 includes two graphs, which show the emission spectra of a switching converter 1 according to the present invention having a basic clock rate $Clk_{base}$ (base frequency/1st harmonic) of 2 MHz. The signal is made up of carrier frequency $f_T$ of 2 MHz and 7 superimposed upper and lower sidebands, which are defined by signal frequencies $f_{S\_sweep}$ (16.2 kHz; 16.5 kHz; 16.8 kHz; 17.1 kHz; 17.4 kHz; 17.7 kHz; 18.0 kHz). The top graph represents the spectrum according to a peak detector (PK). The bottom graph represents the spectrum according to an average detector (AVG).

Figure 5:
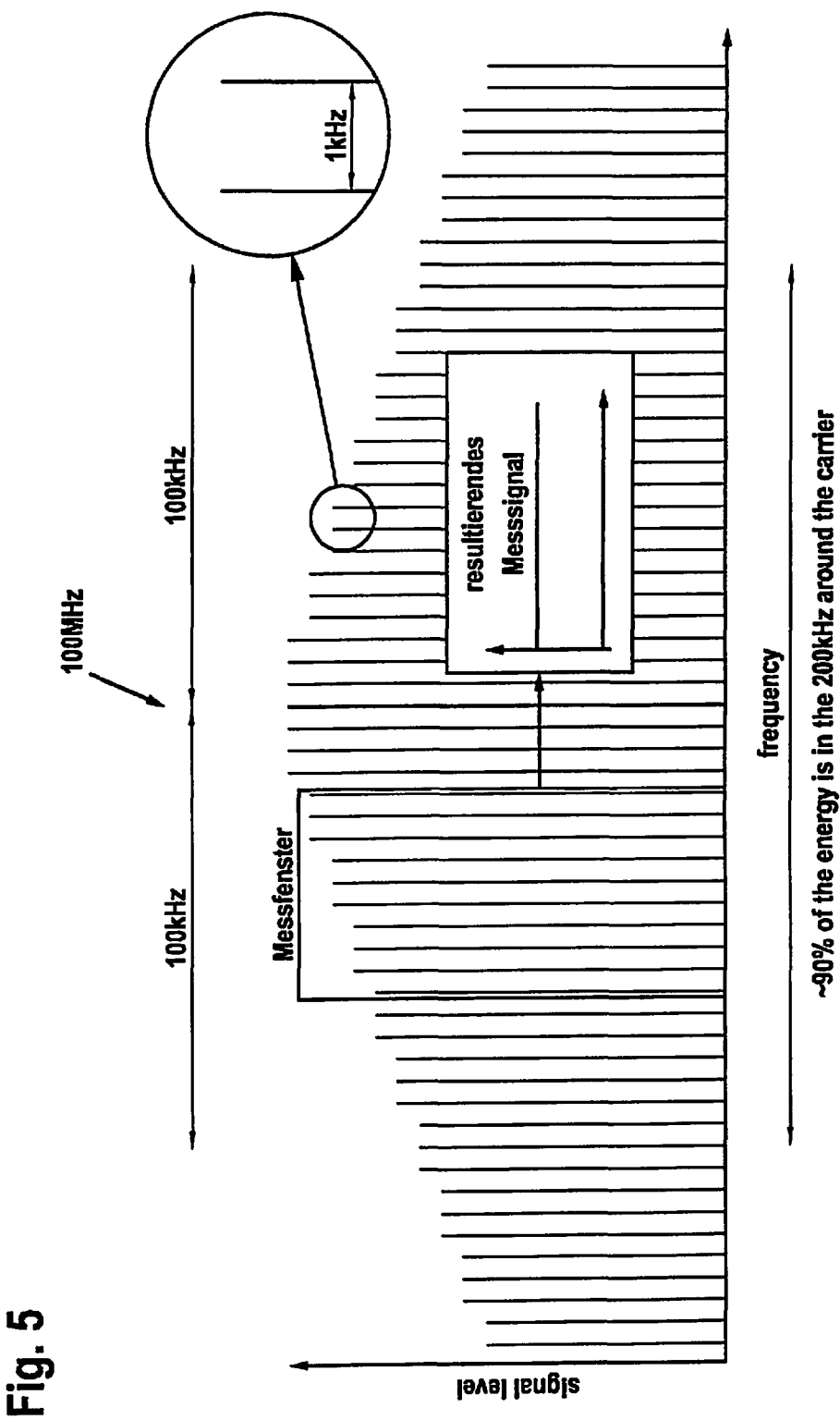
FIG. 5 shows a spectral representation of a frequency modulation and a resulting measuring signal.

FIG. 5 shows a spectral representation of a frequency modulation FM and a resulting measuring signal. The fact that the individual frequencies of the sidebands are not "visible" is due to the used measuring bandwidth (RBW) of 9 kHz and the measuring duration of 1 s. This means that it is not possible to metrologically resolve the individual spectral lines.

Furthermore, the individual frequency lines (sinusoidal signals) have different phase positions with respect to one another. This is defined by the different phase velocity (frequency). The amplitude of the resulting measuring signal is a sum of the individual amplitudes of the frequency lines. These may add up to or subtract from one another due to the superimposition.

Figure 6:
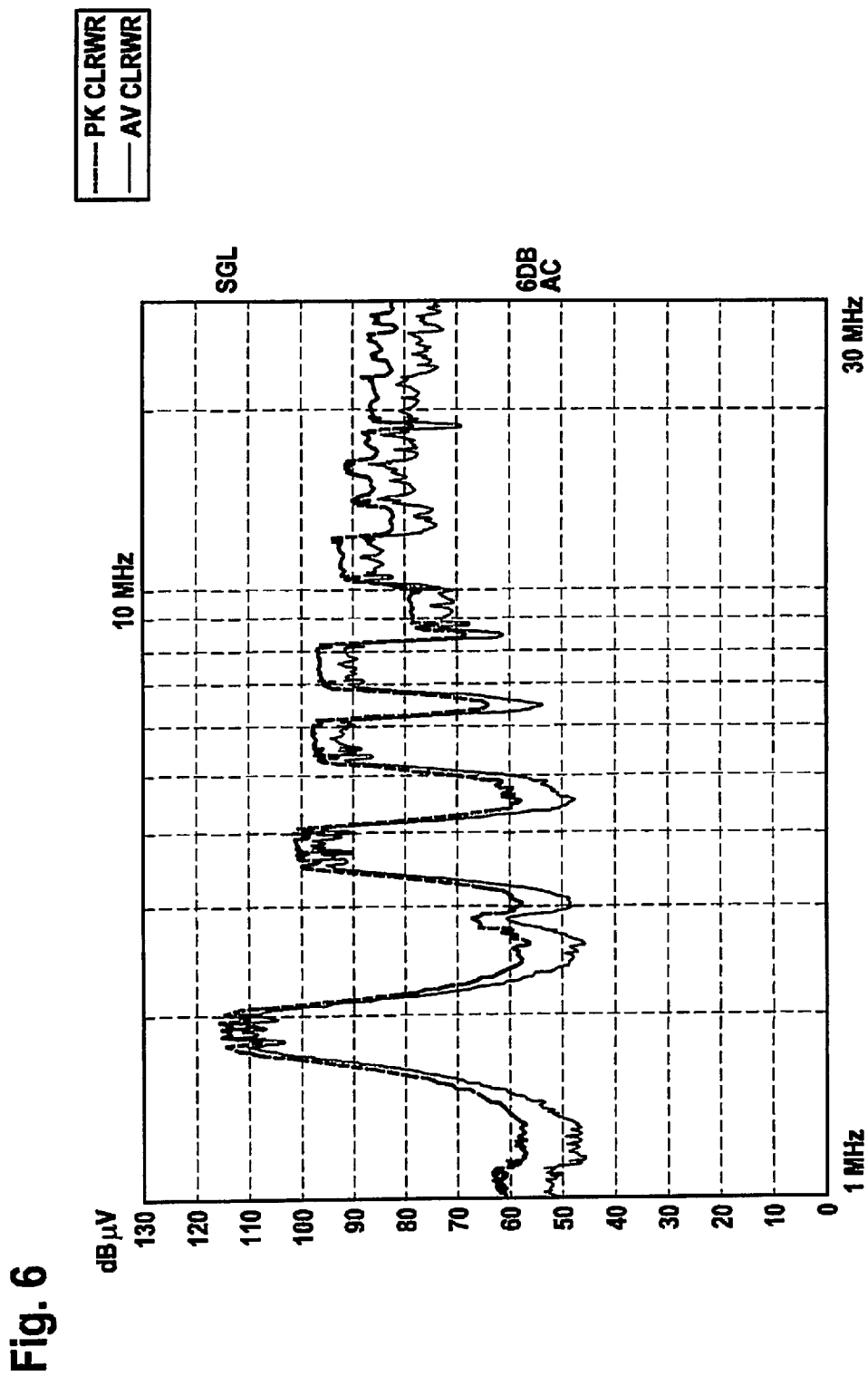
FIG. 6 shows the emission spectrum of a switching converter according to the present invention having a basic clock of 1.8725 MHz and a frequency deviation of 9%.

FIG. 6 shows the emission spectrum of a switching converter 1 according to the present invention having a basic clock $Clk_{base}$ of 1.8725 MHz and a frequency deviation $\Delta f_T$ of 9%. During a broader spectral analysis of the emissions of the switching converter, the effects of the modulation of basic clock $Clk_{base}$ according to the present invention are also apparent in the harmonics.

As already shown in FIGS. 3 and 4, the emission spectrum in FIG. 6 is also represented based on the thick, dotted curve according to a peak detector (PK) and based on the solid curve according to an average detector (AVG).

Another effect which becomes apparent starting at approximately 10 MHz is that the sidebands of the harmonics converge. This may be explained by the fact that the frequency deviation $\Delta f_T$ of 9%, for example, at the basic frequency $Clk_{base}$ also affects the harmonics.

Example: At a basic frequency $Clk_{base}$ of 2 MHz and a frequency deviation $\Delta f_T$ of 9%, a sideband corresponds to 180 kHz ("to the left or right" of the carrier), and at the 9$^{th}$ harmonic (10th harmonic) of 2 MHz (20 MHz), a sideband of 1.8 MHz arises. This means that the upper sideband of the 10th harmonic and the lower sideband of the 11th harmonic overlap.

Figure 7:
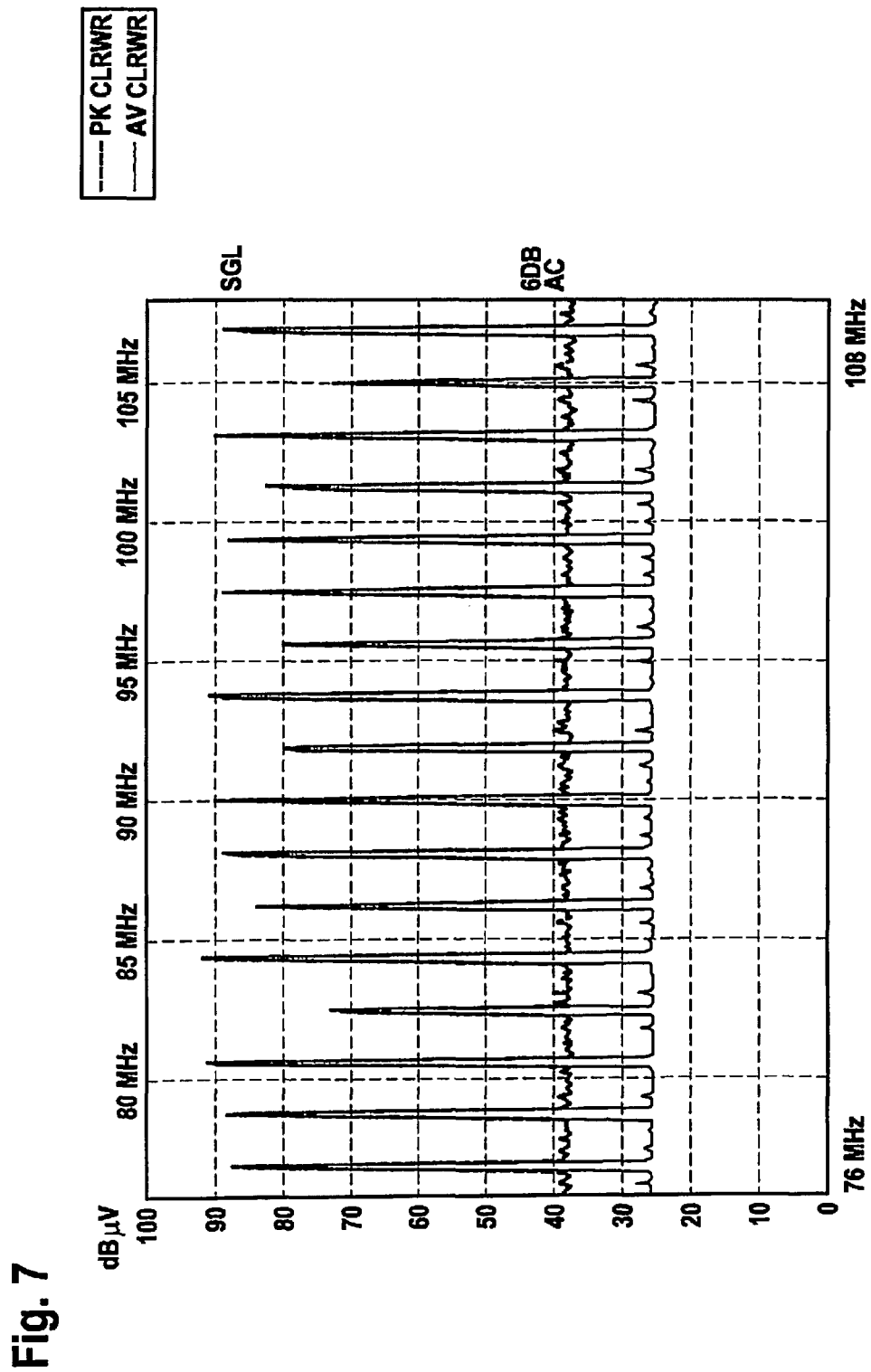
FIG. 7 shows an emission spectrum of a switching converter from the related art.
Figure 8:
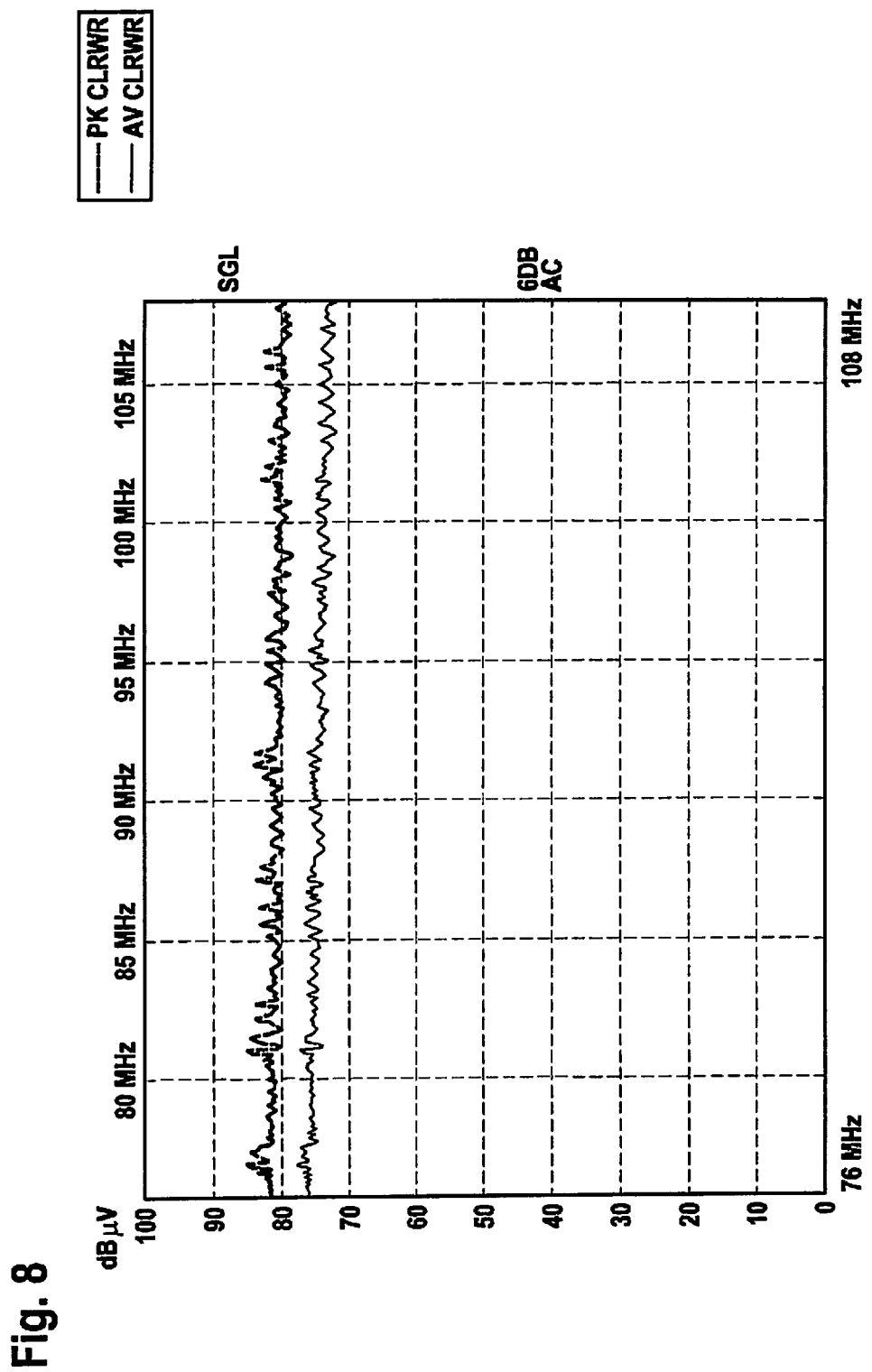
FIG. 8 shows an emission spectrum of a switching converter according to the present invention.

The resulting effect is particularly apparent in a comparison of the spectra in FIGS. 7 and 8. FIG. 7 shows the emission spectrum of a switching converter from the related art. FIG. 8 shows the emission spectrum of a switching converter 1 according to the present invention. Both switching converters are operated at the same basic clock $Clk_{base}$. However, the switching converter according to the present invention is operated at a frequency deviation $\Delta f_T$. The switching converter from the related art is operated without frequency deviation.

As already shown in FIGS. 3, 4 and 6, the emission spectrum in FIG. 6 is also represented based on the thick, dotted curve according to a peak detector (PK) and based on the solid curve according to an average detector (AVG).

A harmonic at approximately 100 MHz has a sideband of 9 MHz at a deviation of 9%. This means that in this frequency range an overlap of approximately 5 sidebands is present at a frequency point. For a measuring window (common here) of 120 kHz, this yields 33 individual frequency lines (sidebands×RBW/$f_{Smax}$→5×120 kHz/18 kHz), which then generate a measuring signal/measuring level in keeping with their amplitude and phase position. The ultimately indicated level is still dependent on the detectors used (AVG, PK), the modulation frequencies $f_{S\_sweep}$, and the measuring duration.

Figure 9:
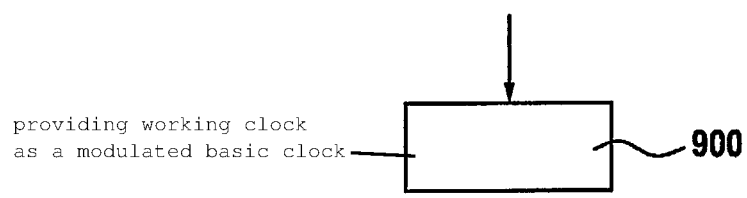
FIG. 9 shows a flow chart of the method according to the present invention.

FIG. 9 shows the method according to the present invention for a switching converter 1 including a clock generator 13, which provides a working clock $Clk_{modulated}$ for switching converter 1. In step 900, working clock $Clk_{modulated}$ is provided as a modulated basic clock $Clk_{base}$.

What is claimed is:

1. A switching converter, comprising:
   an input interface for providing an input voltage;
   an output interface for providing at least one output voltage;
   a voltage conversion device for converting the provided input voltage into one of the at least one output voltage; and
   a clock generator for providing a working clock, the clock generator being configured in such a way that the clock generator provides a modulated basic clock as the working clock, wherein the clock generator modulates the basic clock at a predetermined frequency deviation and at least one predetermined modulation frequency and at least one predetermined modulation period duration.

2. The switching converter as recited in claim 1, wherein the at least one predetermined modulation frequency includes multiple modulation frequencies, the multiple modulation frequencies being equidistant with respect to one another.

3. The switching converter as recited in claim 1, wherein the at least one predetermined modulation frequency includes multiple modulation frequencies, the multiple modulation frequencies having a logarithmic separation from one another.

4. The switching converter as recited in claim 1, wherein the modulation period duration is between 5 ms and 15 ms.

5. The switching converter as recited in claim 1, wherein the modulation period duration is between 10 ms and 11.1 ms.

6. The switching converter as recited in claim 1, wherein the at least one modulation frequency is/are between 10 kHz and 20 kHz.

7. The switching converter as recited in claim 1, wherein the at least one modulation frequency is/are between 16 kHz and 18 kHz.

8. The switching converter as recited in claim 1, wherein the frequency deviation is less than 15% of the basic clock.

9. The switching converter as recited in claim 1, wherein the frequency deviation is less than 10% of the basic clock.

10. The switching converter as recited in claim 1, wherein the frequency deviation is 9% of the basic clock.

11. A control unit for a motor vehicle, the control unit including at least one switching converter, the at least one switching converter including an input interface for providing an input voltage, an output interface for providing at least one output voltage, a voltage conversion device for converting the provided input voltage into one of the at least one output voltage, and a clock generator for providing a working clock, the clock generator being configured in such a way that the clock generator provides a modulated basic clock as the working clock, wherein the clock generator modulates the basic clock at a predetermined frequency deviation and at least one predetermined modulation frequency and at least one predetermined modulation period duration.

12. A method for operating a switching converter including a clock generator, the method comprising:
providing a working clock for the switching converter, the working clock being provided as a modulated basic clock, wherein the basic clock is modulated at a predetermined frequency deviation and at least one predetermined modulation frequency and at least one predetermined modulation period duration.

13. The control unit as recited in claim 11, wherein the control unit is configured to activate a passenger protection device.

* * * * *